(12) United States Patent
Lomax, Jr. et al.

(10) Patent No.: US 6,967,585 B2
(45) Date of Patent: Nov. 22, 2005

(54) INPUT VOLTAGE SENSE CIRCUIT IN A LINE POWERED NETWORK ELEMENT

(75) Inventors: Charles Weston Lomax, Jr., Raleigh, NC (US); James Xavier Torok, Raleigh, NC (US)

(73) Assignee: ADC DSL Systems, Inc., Eden Prairie, MN (US)

( * ) Notice: Subject to any disclaimer, the term of this patent is extended or adjusted under 35 U.S.C. 154(b) by 113 days.

(21) Appl. No.: 10/449,496

(22) Filed: May 30, 2003

(65) Prior Publication Data

US 2004/0239513 A1 Dec. 2, 2004

(51) Int. Cl.⁷ ............................................. G08B 21/00
(52) U.S. Cl. ........................... 340/660; 363/20; 307/31
(58) Field of Search .................. 340/660; 363/16, 363/41, 97, 131, 20; 323/299; 307/11, 31

(56) References Cited

U.S. PATENT DOCUMENTS

| | | | |
|---|---|---|---|
| 5,283,905 A | | 2/1994 | Saadeh et al. |
| 5,430,633 A | * | 7/1995 | Smith .......................... 363/20 |
| 5,602,724 A | * | 2/1997 | Balakrishnan ........... 363/21.15 |
| 5,666,538 A | | 9/1997 | DeNicola |
| 5,774,689 A | | 6/1998 | Curtis et al. |
| 5,796,595 A | * | 8/1998 | Cross .......................... 363/71 |
| 5,953,237 A | | 9/1999 | Indermaur et al. |
| 6,176,710 B1 | | 1/2001 | Ewing et al. |
| 6,199,180 B1 | | 3/2001 | Ote et al. |
| 6,208,714 B1 | | 3/2001 | Brablec |
| 6,366,657 B1 | | 4/2002 | Yagel et al. |
| 6,504,267 B1 | * | 1/2003 | Giannopoulos .............. 307/31 |
| 6,546,089 B1 | | 4/2003 | Chea, Jr. et al. |
| 6,587,953 B1 | | 7/2003 | Torikai |
| 6,606,383 B1 | | 8/2003 | Robinson et al. |
| 6,754,089 B2 | * | 6/2004 | Balakrishnan et al. ........ 363/16 |
| 6,809,678 B2 | * | 10/2004 | Vera et al. .................. 341/166 |
| 6,825,726 B2 | | 11/2004 | French et al. |
| 2002/0002593 A1 | | 1/2002 | Ewing et al. |
| 2003/0185385 A1 | | 10/2003 | Boudreaux, Jr. et al. |

* cited by examiner

*Primary Examiner*—John Tweel, Jr.
(74) *Attorney, Agent, or Firm*—Fogg and Associates, LLC; Laura A. Ryan

(57) ABSTRACT

Methods and systems of monitoring voltage input to network elements are provided. One method includes receiving an input voltage for a line-powered network element, applying the input voltage across a primary winding of a flyback power converter during an on-time of a primary switch, and transferring the input voltage from the primary winding to a secondary winding of the flyback power converter during an off-time of the primary switch. The method further includes sensing the voltage of the secondary winding during the on-time of the primary switch; and drawing minimal current from the flyback power converter.

22 Claims, 6 Drawing Sheets

INPUT VOLTAGE SENSE CIRCUIT IN A LINE POWERED NETWORK ELEMENT

CROSS REFERENCE TO RELATED APPLICATION

This application is related to co-pending application Ser. No. 10/134,323, filed on Apr. 29, 2002 and entitled MANAGING POWER IN A LINE POWERED NETWORK ELEMENT (the '323 Application). The '323 Application is incorporated herein by reference.

This application is also related to the following applications filed on even date herewith:

Application Ser. No. 10/448,910, entitled "FUNCTION FOR CONTROLLING LINE POWERING IN A NETWORK," (the '358 Application).

Application Ser. No. 10/449,259, entitled "LINE POWERED NETWORK ELEMENT," (the '359 Application).

Application Ser. No. 10/449,682, entitled "ELEMENT MANAGEMENT SYSTEM FOR MANAGING LINE-POWERED NETWORK ELEMENTS," (the '360 Application).

Application Ser, No. 10/449,917, entitled "CURRENT SENSE CIRCUIT IN A LINE POWERED NETWORK ELEMENT," (the '589 Application).

Application Ser. No. 10/448,884, entitled "LIGHTNING PROTECTION FOR A NETWORK ELEMENT," (the '591 Application).

Application Ser. No. 10/449,546, entitled "SPLITTER" (the '592 Application).

Application Ser. No. 10/449,547, entitled "POWER RAMP-UP IN A LINE-POWERED NETWORK ELEMENT SYSTEM," (the '593 Application).

The '358, '359, '360, '589, '591, '592 and '593 applications are incorporated herein by reference.

TECHNICAL FIELD

The present invention relates generally to the field of telecommunications, and, in particular, to input voltage sensing in a line powered network.

BACKGROUND

Telecommunications networks transport signals between user equipment at diverse locations. A telecommunications network includes a number of components. For example, a telecommunications network typically includes a number of switching elements that provide selective routing of signals between network elements. Additionally, telecommunications networks include communication media, e.g., twisted pair, fiber optic cable, coaxial cable or the like that transport the signals between switches. Further, some telecommunications networks include access networks.

For purposes of this specification, the term access network means a portion of a telecommunication network, e.g., the public switched telephone network (PSTN), that allows subscriber equipment or devices to connect to a core network. For example, an access network is the cable plant and equipment normally located in a central office or outside plant cabinets that directly provides service interface to subscribers in a service area. The access network provides the interface between the subscriber service end points and the communication network that provides the given service. An access network typically includes a number of network elements. A network element is a facility or the equipment in the access network that provides the service interfaces for the provisioned telecommunication services. A network element may be a stand-alone device or may be distributed among a number of devices.

There are a number of conventional forms for access networks. For example, the digital loop carrier is an early form of access network. The conventional digital loop carrier transported signals to and from subscriber equipment using two network elements. At the core network side, a central office terminal is provided. The central office terminal is connected to the remote terminal over a high-speed digital link, e.g., a number of T1 lines or other appropriate high-speed digital transport medium. The remote terminal of the digital loop carrier typically connects to the subscriber over a conventional twisted pair drop.

The remote terminal of a digital loop carrier is often deployed deep in the customer service area. The remote terminal typically has line cards and other electronic circuits that need power to operate properly. In some applications, the remote terminal is powered locally. In some networks, the remote terminal is fed power over a line from the central office. This is referred to as line feeding or line powering and can be accomplished through use of an AC or a DC source. Thus, if local power fails, the remote terminal still functions because it is typically powered over the line using a battery-backed power source. This allows the remote terminal to offer critical functions like lifeline plain old-fashioned telephone service (POTS) even during a power outage.

Over time, the variety of services offered over telecommunications networks has changed. Originally, the telecommunications networks were designed to carry narrowband, voice traffic. More recently, the networks have been modified to offer broadband services. These broadband services include services such as digital subscriber line (DSL) services. As time goes on, other broadband services will also be supported. These new services often come with increased power requirements.

Line-powered network elements in access networks rely on the central office for continuous power. As the distance between the central office and a network element increases, the amount of power required to provide a constant voltage at the network element increases. In some instances a faulty channel card, a short on a channel card or even improper installation of a channel card causes an increase in the current draw at the line powered network element. The current increases and the voltage received at the line powered network element (CPE, RT) decreases. When the input voltage at the network element begins to fall an indicator is needed to prohibit a power source shut down.

Input voltage may be too low, and current draw may be too high for many reasons. If the span used for powering the network elements is too high in resistance, the voltage drop on the span line will be large. In some instances, this would occur with an improper installation of equipment. In this situation, the voltage at the network element sink is lower. Since the network element sink will consume a fixed amount of power, it must consume more current to operate at a lower voltage. A critical point may be reached where the voltage drop on the span equals the input voltage at the network element sink, and is one half of the network element source output voltage and power. If the current increases beyond this point the network element sink power supply will drop out and cease to operate. At this point the power system will go through a re-boot process. As this is lengthy and will cause a service outage, this situation must be avoided.

Therefore, there is a need in the art for detecting line input voltage for line powered network elements and to provide an indicator.

SUMMARY

A method of monitoring input voltage for a network element is provided. The method includes receiving an input voltage for a line-powered network element, applying the input voltage across a primary winding of a flyback power converter during an on-time of a primary switch, and transferring the input voltage from the primary winding to a secondary winding of the flyback power converter during an off-time of the primary switch. The method further includes sensing the voltage of the secondary winding during the on-time of the primary switch and drawing minimal current from the flyback power converter.

An apparatus is provided. The apparatus includes a flyback power converter and a monitoring circuit coupled to a secondary side of the flyback power converter. The monitoring circuit selectively senses an input voltage to the flyback power converter from a reflected voltage of the input voltage, compares the input voltage to a reference voltage and provides an indication when the input voltage differs from the reference voltage by a defined amount. The monitoring circuit is adapted to draw minimal current from the flyback power converter.

DETAILED DESCRIPTION

Figure 1:
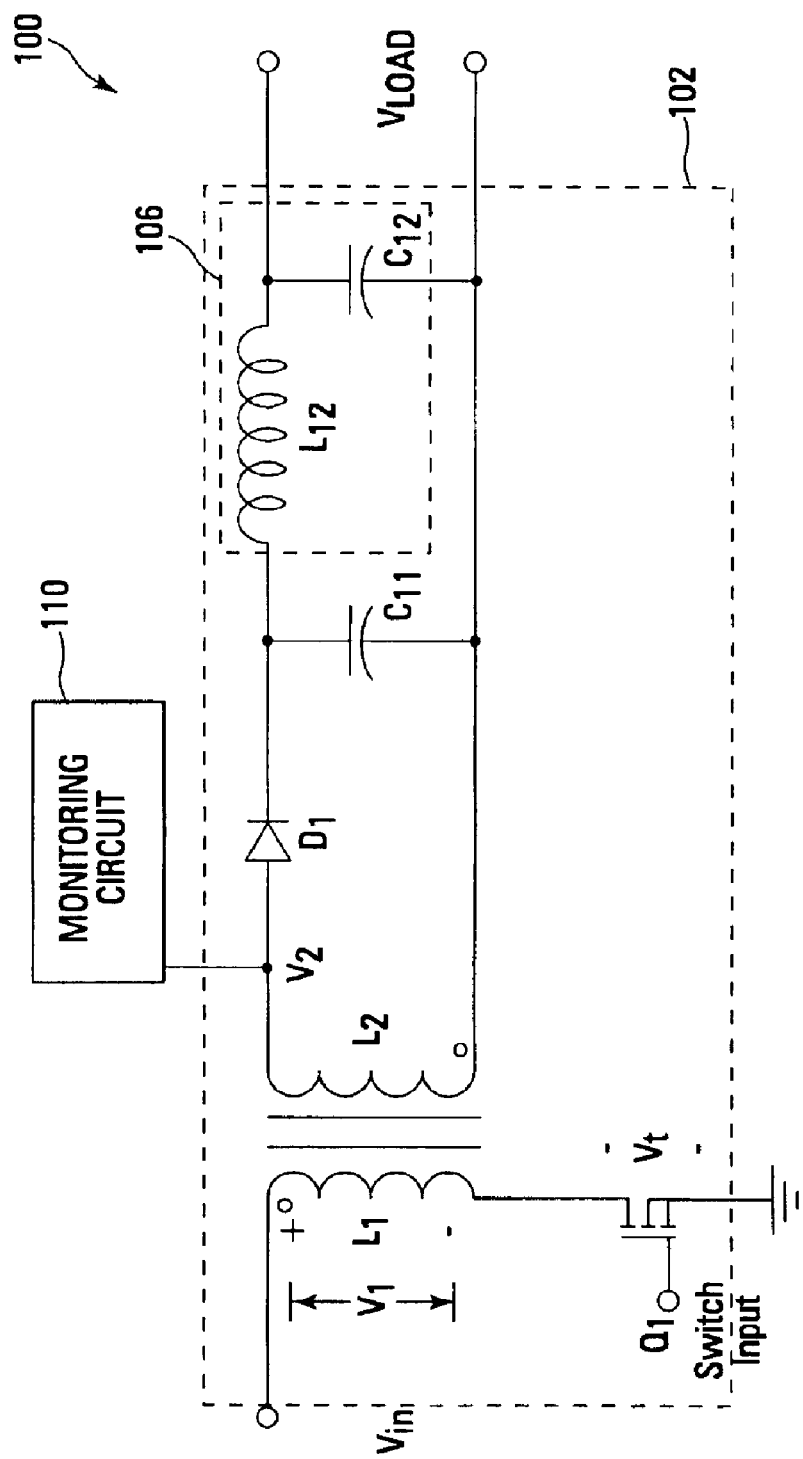
FIG. 1 is a diagram of one embodiment of an monitoring circuit coupled to a flyback power converter according to the teachings of the present invention.

In the following detailed description, reference is made to the accompanying drawings that form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

Embodiments of the present invention address problems with providing power over communication lines to line powered network elements in an access network. Particularly, embodiments of the present invention provide a monitoring circuit for line powered network elements that measures the input voltage at the line powered network element.

Embodiments of the present invention provide methods and systems for monitoring the input voltage of line powered network elements. An increase in current draw can be detected by a decrease in the input voltage received at the line powered network element. Line powered network elements such as customer premises equipment rely on power provided by a central office, remote terminal, or other network element. In one embodiment, a voltage sensing or monitoring circuit is employed to monitor a representation of the input voltage to the network element as an indicator of the line power headroom of the network element. The monitoring circuit monitors the input voltage and draws a small amount of current. In some applications there is a need to reduce the power consumed by line cards in the network element. If there is a faulty channel card that draws more power than the card is designed for, there is a need for a way to detect it and flag it. In other embodiments the objective is to lower power usage in the remote terminal to allow voltage across the span between the source network element and a remote line-powered network element to go back up.

Embodiments of the present invention further provide methods and systems for determining when the input voltage differs from a desired input voltage and when the difference exceeds a defined criterion. This enables a preemptory shut down of services to the network element before damage has occurred or a reduction in power usage in the network element. Other embodiments further provide an alarm signal when the voltage difference exceeds the defined criterion. This allows the network to shut down services to reduce power drawn by the line powered element when the input voltage falls and a indicator or flag has been set.

Embodiments of the present invention provide a method for sensing the input voltage at the network element sink, and detecting if it is close to the critical point. If it is approaching this point, the power consumption of the network element sink is reduced to increase the input voltage and avoid power supply dropout and reboot.

Embodiments of the present invention provide a method for determining if the line power delivered on a span (communication line) is adequate to keep the line powered network element running properly, with appropriate margin headroom on the input voltage. If the input voltage is not high enough, an alarm may be generated and actions may be taken including reduction in the quality of service to reduce power consumption of the line powered network element. Lower priority services may optionally be disabled.

In one embodiment, the line powered network element utilizes a flyback topology switching power supply. A diode on the secondary of the power supply transformer rectifies the output current. A diode connected in the opposite direction rectifies the reflected input voltage on the secondary of the transformer, so that it may be compared to thresholds for action such as alarm generation, service reduction and power reduction. The input voltage is filtered by capacitors and resistors to convert the signal to a DC value that is proportional to the input voltage. This signal may now be measured by use of an analog to digital converter, a threshold comparator, or the like. It may also be used to directly control power consumption reduction and service quality reduction of the network element.

FIG. 1 is a diagram of one embodiment of a monitoring circuit coupled to a flyback power converter, shown generally at 100, according to the teachings of the present invention. System 100 includes one embodiment of a flyback power converter 102 and a monitoring circuit 110. In one embodiment, flyback power converter 102 includes, switch Q1, first and second windings L1 and L2, a diode D1, capacitor C11, and an output filter 106. In this embodiment, output filter 106 includes an inductor L12 and a capacitor C12. It is understood, that output filter 106 is by example and in other embodiments may comprise alternate components. Also, flyback power converter 102 is shown for illustration to include an output filter 106 and is not restricted to a flyback power converter with an output filter.

In operation, flyback power converter 102 receives an input voltage Vin. During the on-time of switch Q1 a constant voltage V1, V1=(Vin−Vt) wherein Vt is the voltage drop across switch Q1, is applied across the primary winding L1 of converter 102. When switch Q1 is turned off, V1 drops to zero and the energy stored in the core causes the secondary winding L2 to "fly back" and conduct current to the load. The voltage V2 on the secondary winding L2 during the flyback time is determined by the turns ratio (the ratio of the number of turns in the secondary winding L2 of the transformer to the number of turns in the primary winding L1). Therefore the voltage V2 on the secondary winding L2 is proportional to the input voltage Vin (assuming Vt is negligible).

Figure 2A:
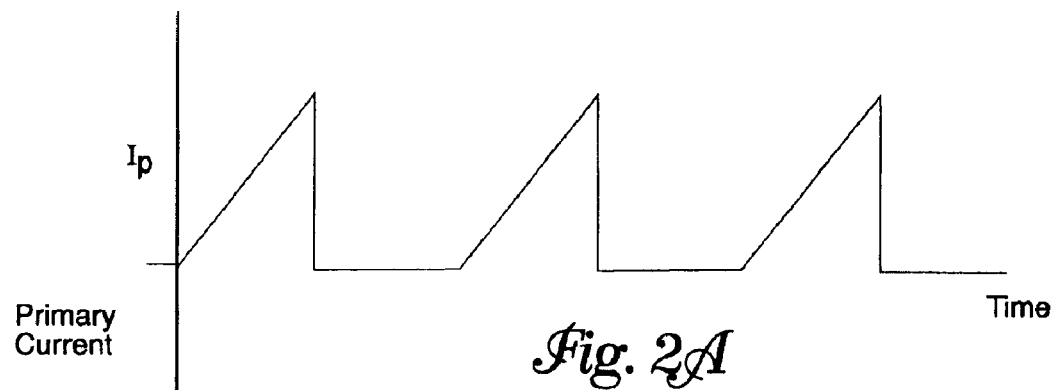
FIG. 2a is an illustration of a waveform, of the primary currents on a flyback power converter according to the teachings of the present invention.
Figure 2B:
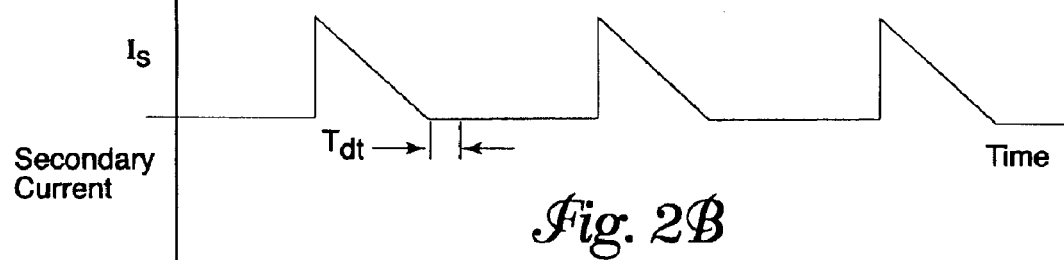
FIG. 2b is an illustration of a waveform of the secondary currents of one embodiment of a flyback power converter according to the teachings of the present invention.
Figure 2C:
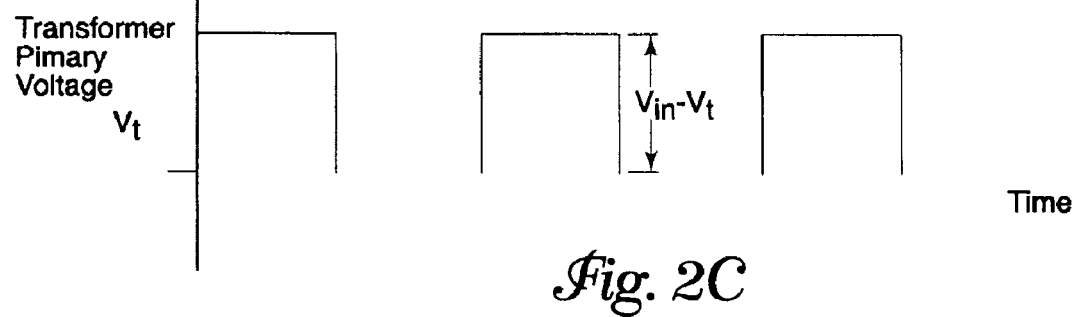
FIG. 2c is an illustration of a waveform of the transformer primary voltage of one embodiment of a flyback power converter according to the teachings of the present invention.

In this embodiment, current does not flow simultaneously in both windings L1 and L2. Energy received from the input voltage Vin is stored on L1 and is transferred to L2 when switch Q1 is opened. In one embodiment, flyback power converter 102 operates in a discontinuous mode. FIG. 2a is a graphical illustration of the primary current Ip of the primary winding L1 of one embodiment of a flyback power converter, such as flyback power converter 102. FIG. 2b is a graphical illustration of the secondary current Is of the secondary winding L2 of one embodiment of a flyback power converter, such as flyback power converter 102. In the discontinuous mode all the energy stored in the primary winding L1 during the switch Q1 on-time is completely delivered to the secondary winding L2 and to a load before the next cycle. As shown in FIG. 2b, there is also a dead time Tdt between the instant the secondary current Is reaches zero and the start of the next cycle. The dead time is when nothing in the transformer is energized. FIG. 2c is a graphical illustration of a transformer primary voltage V1 for a flyback power converter, such as flyback power converter 102.

Figure 4:
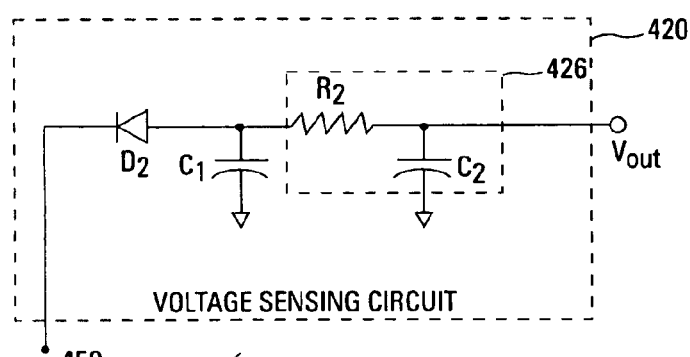
FIG. 4 is one embodiment of a voltage sensing circuit, shown generally at 420, according to the teachings of the present invention.

When Q1 turns off, the current in the primary winding L1 forces the reversal of polarities on all windings. At the instant of turnoff ideally all the energy from the primary winding L1 is transferred to the secondary winding L2. When Q1 turns off and the energy is transferred to L2, D1 is forward biased and capacitor C11 is charged and an output voltage Vload is provided. Referring to FIG. 4, during this time D2 is reverse biased. When Q1 turns on, D1 becomes reverse biased, and D2 conducts a small amount of current to charge capacitor C2 as shown in FIG. 4 to a value that is proportional to the input voltage Vin. Monitoring circuit 110 monitors the voltage V2 on the secondary winding L2 without drawing current from converter 102 and provides an output voltage Vout that is proportional to input voltage Vin.

Figure 3:
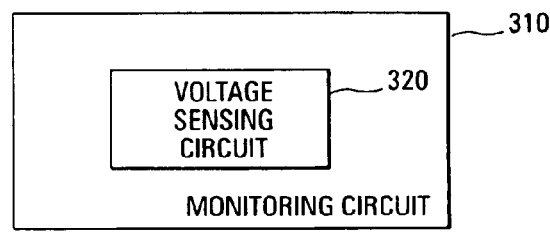
FIG. 3 is one embodiment of a monitoring circuit shown generally at 310, according to the teachings of the present invention.

FIG. 3 is one embodiment of a monitoring circuit shown generally at 310, according to the teachings of the present invention. In this embodiment, monitoring circuit 310 comprises a voltage sensing circuit 320 adapted to selectively sense the voltage for a circuit or a power supply such as the flyback power converter 102 of FIG. 1. In one embodiment, monitoring circuit 310 senses the voltage V2 for the flyback power converter 102 of FIG. 1. Voltage V2 is proportional to the input voltage Vin of flyback power converter 102. V2 is indicative of the amount of voltage headroom available on the span used for line powering. In one embodiment, the circuit is a network element as discussed below with respect to FIGS. 6, 7, and 8.

FIG. 4 is one embodiment of a voltage sensing circuit, shown generally at 420, according to the teachings of the present invention. Voltage sensing circuit 420 includes a diode D2 that permits a small amount of current to flow in voltage sensing circuit 420, therefore drawing little current from a respective circuit. Voltage sensing circuit 420 further includes a capacitor C1 and a resistance-capacitance output filter 426 comprised of resistor R2 and capacitor C2. An alternate output filter may be substituted for filter 426. In some embodiments, output filter 426 may not be included in the voltage sensing circuit 420. Output voltage Vout is representative of a measurement of the voltage at 450.

Figure 5:
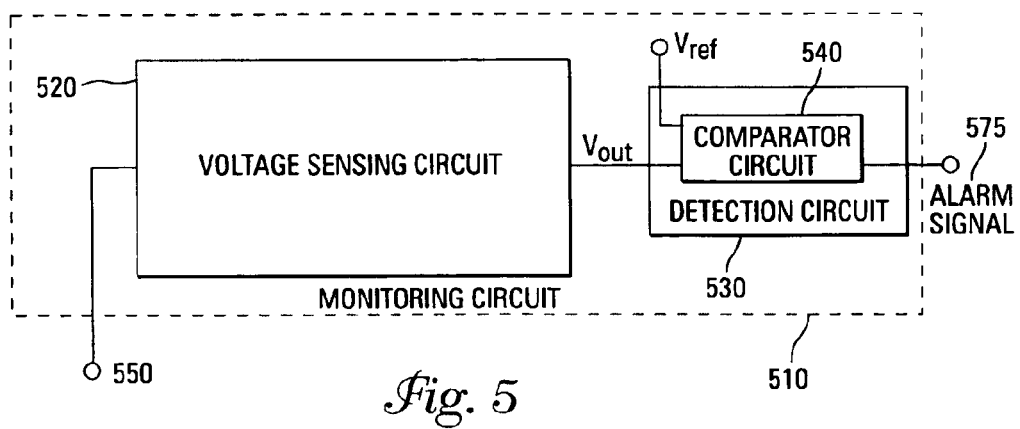
FIG. 5 is another embodiment of a monitoring circuit shown generally at 510, according to the teachings of the present invention.

FIG. 5 is another embodiment of a monitoring circuit shown generally at 510, according to the teachings of the present invention. Monitoring circuit 510 includes a voltage sensing circuit 520 and a detection circuit 530. In one embodiment, voltage sensing circuit 520 is as found in FIG. 4 above. In operation, monitoring circuit 510 senses the voltage at 550 and provides an output voltage Vout representative of the voltage at 550. Voltage sensing circuit 520 draws a small amount of current. In one embodiment, detection circuit 530 includes a comparator circuit 540 that compares Vout to a reference voltage Vref and when Vout differs from Vref by a defined criterion detection circuit 530 produces an alarm signal 575. In one embodiment, alarm signal 575 provides an indication that the voltage provided to a line powered network element differs from a desired voltage. For example, in one embodiment the alarm signal 575 indicates that the voltage to the line powered network element fell below a desired level of headroom.

Figure 6:
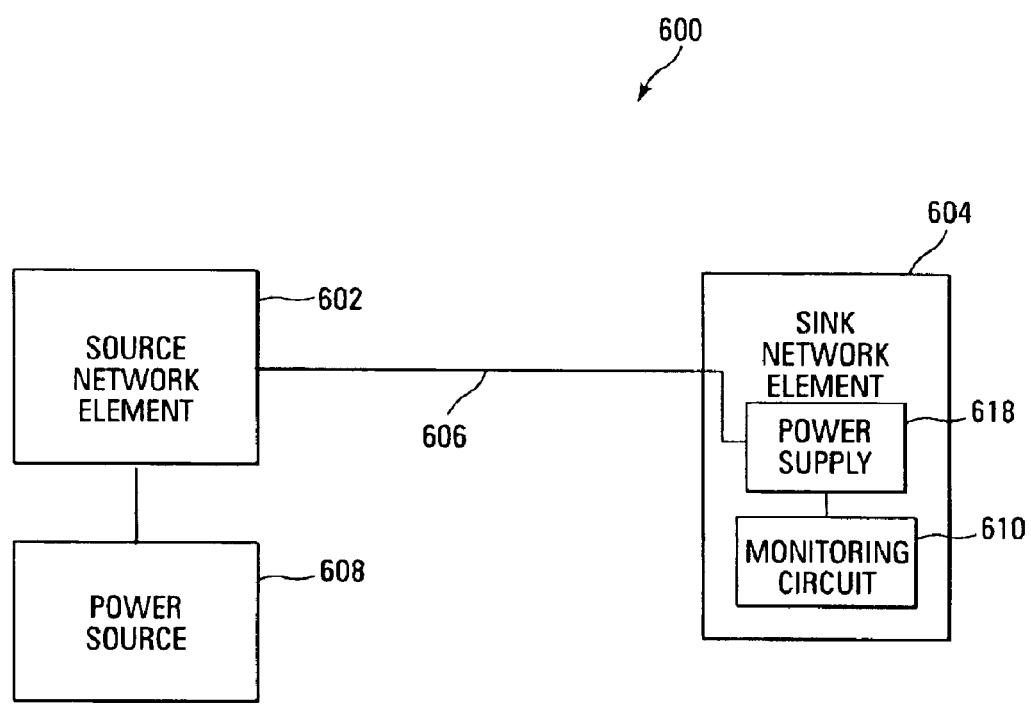
FIG. 6 is a block diagram of one embodiment of a network that includes at least one line-powered network element according to the teachings of the present invention.

FIG. 6 is a block diagram of one embodiment of a network 600 that includes at least one line-powered network element. Network 600 includes at least one network element 602 (referred to here as a "source network element") that provides power to at least one other network element 604 (referred to here as a "sink network element") over a communication medium 606 (referred to here as a "power communication medium"). In the one embodiment, the source network element 602 is a central office terminal located in a central office of a service provider and the sink network element 604 is a remote terminal located in the outside plant, for example, in an environmentally hardened enclosure. In such an embodiment, both the central office terminal 602 and the remote terminal 604 are included in an access network that is coupled to one or more items of customer located equipment (for example, a modem, wireless access point, or telephone set) to a communications network such as the Internet or public switched telephone network (PSTN). The central office terminal provides power to the remote terminal over at least one twisted-pair telephone line. That is, in such an embodiment, the twisted-pair telephone line is the power communication medium.

The source network element 602 is coupled to a power source 608 in order to obtain power that is used to power the source network element 602 and to provide power to the sink network element 604 over the power communication medium 606. In one embodiment, the power source 608 includes a direct current (DC) and/or an alternating current (AC) power source such as a battery and/or connection to a main power grid. In other embodiments, other power sources are used.

The source network element 602 and the sink network element 604 communicate with one another using some type of communication link. For example, in one embodiment, a central office terminal and a remote terminal communicate over a DSL communication link provided between the central office terminal and the remote terminal. Examples of DSL communication links include a high-bit rate DSL (HDSL) link, high-bit rate digital subscriber line 2 (HDSL2) link, high-bit rate digital subscriber line 4 (HDSL4) link, or symmetric DSL link conforming to the International Telecommunication Union (ITU) standard G991.2 (a G.SHDSL Link). In other embodiments, other types of communication links are used.

In the embodiment shown in FIG. 6, the communication link is provided on the same communication medium that is used to supply power from the source network element 602 to the source network element 604. In other embodiments, a separate communication medium is used to provide such a communication link between the source network element 602 and the sink network element 604.

Both the source network element 602 and the sink element 604 are typically coupled to other network elements. For example, in one embodiment, the source network element 602 is coupled to an upstream network element such as a switch and the sink network element 604 is coupled to one or more downstream network elements such as various items of customer located equipment (for example, a modem, wireless access point, or telephone set).

In one embodiment, source network element 604 includes a power supply 618 that is coupled to the communication medium 606. The power supply 618 extracts the power supplied on the communication medium 606 by the source network element 602. The extracted power is used to power various components of the source network element 604. In one embodiment, power supply 618 is a flyback power converter. In one embodiment, sink network element 604 further includes a monitoring circuit 610 coupled to the power supply 618. In one embodiment, monitoring circuit 610 is as described in the one or more embodiments described above with respect to FIGS. 1, 3, and 5.

Figure 7:
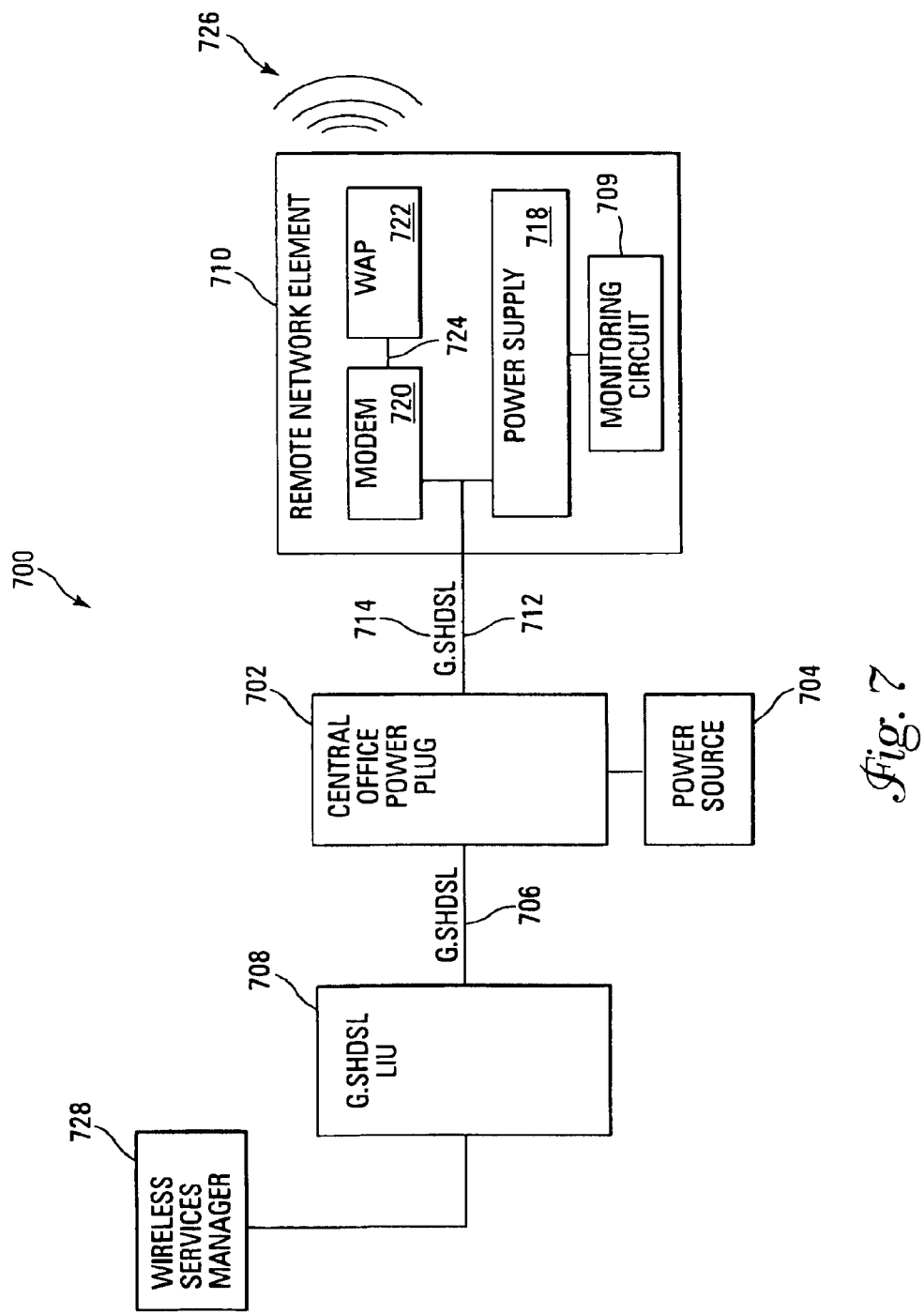
FIG. 7 is one embodiment of a wireless network according to the teachings of the present invention.

FIG. 7 is a block diagram of one embodiment of a wireless network 700. The embodiment of a wireless network 700 shown in FIG. 7 includes a central office power plug 702 that is coupled to a power source 704. In one embodiment, central office power plug 702 is implemented using an embodiment of the central office terminal 800 described below. An upstream G.SHDSL communication link 706 is provided to the central office power plug 702 over an upstream communication medium (for example, a twisted-pair telephone line). The upstream G.SHDSL communication link 706 couples the central office power plug 702 to a G.SHDSL line interface unit 708. The G.SHDSL line interface unit 708 is coupled to an upstream network (not shown) such as the Internet. In one such embodiment, the G.SHDSL line interface unit 708 is inserted into a subscriber access multiplexer (not shown) in order to couple the G.SHDSL line interface unit 708 to the upstream network.

The wireless network 700 also includes a remote network element 710. Remote network element 710 is powered by a twisted-pair telephone line 712 that is coupled between the central office power plug 702 and the remote network element 710. A downstream G.SHDSL communication link 714 is provided over the twisted-pair telephone line 712. The central office power plug 702 supplies power for the remote network element 710 on the twisted-pair telephone line 712 in the same manner as described above in connection with FIG. 6. The remote network element 710 includes a power supply 718 that is coupled to the twisted-pair telephone line 712. The power supply 718 extracts the power supplied on the twisted-pair telephone line 712 by the central office power plug 702. The extracted power is used to power various components of the remote network element 710.

In one embodiment, remote network element 710 further includes a monitoring circuit 709 coupled to the power supply 718. In one embodiment, monitoring circuit 610 is as described in the one or more embodiments described above with respect to FIGS. 1, 3, and 5.

The remote network element 710 also includes a G.SHDSL modem 720 that modulates and demodulates the G.SHDSL signals carried over the twisted-pair telephone line 712. The modem 720 is coupled to a wireless access point 722 over an Ethernet connection 724. The wireless access point 722 transmits traffic to, and receives traffic from various wireless devices (not shown) over a wireless link 726. Examples of wireless devices include computers or personal digital assistants having wireless transceivers. In one embodiment, the wireless access point 722 is a wireless access point that supports the Institute for Electrical and Electronic Engineers (IEEE) 802.11b standard (also referred to as "WI-FI").

The wireless network 700 also includes a wireless services manager 728 that manages the wireless services provided over the wireless network 700. For example, in one embodiment, wireless services manager 728 manages authentication and other subscriber and service-related information using the Remote Authentication Dial-in User Service (RADIUS) protocol. In one embodiment, the wireless services manager 728 is coupled to the G.SHDSL line interface unit 708 using a local area network connection (for example, an Ethernet connection).

In operation, wireless traffic is received by the wireless access point 722 from various wireless devices. The wireless traffic is transmitted to the central office power plug 702 by the G.SHDSL modem 720 over the twisted-pair telephone line 712. A splitter (not shown in FIG. 7) splits off that portion of the signal used for providing the G.SHDSL communication link and provides it to a communications interface (not shown in FIG. 7) of the central office power plug 702 for appropriate processing. The communications interface transmits the traffic to the G.SHDSL line interface unit 708 over the upstream G.SHDSL communication link 706, where the traffic is processed and forwarded to the upstream network by the line interface unit 708. In the downstream direction, traffic is received by the G.SHDSL line interface unit 708 from the upstream network. The traffic is transmitted to the central office power plug 702 over the upstream communication link 706. The traffic is combined with power from a power supply (not shown in FIG. 7) of the central office power plug 702 by the splitter and the combined signal is transmitted on the twisted-pair telephone line 712. The signal is received by the G.SHDSL modem 720, which forwards the traffic to the wireless access point 722 for transmission to the wireless devices.

Figure 8:
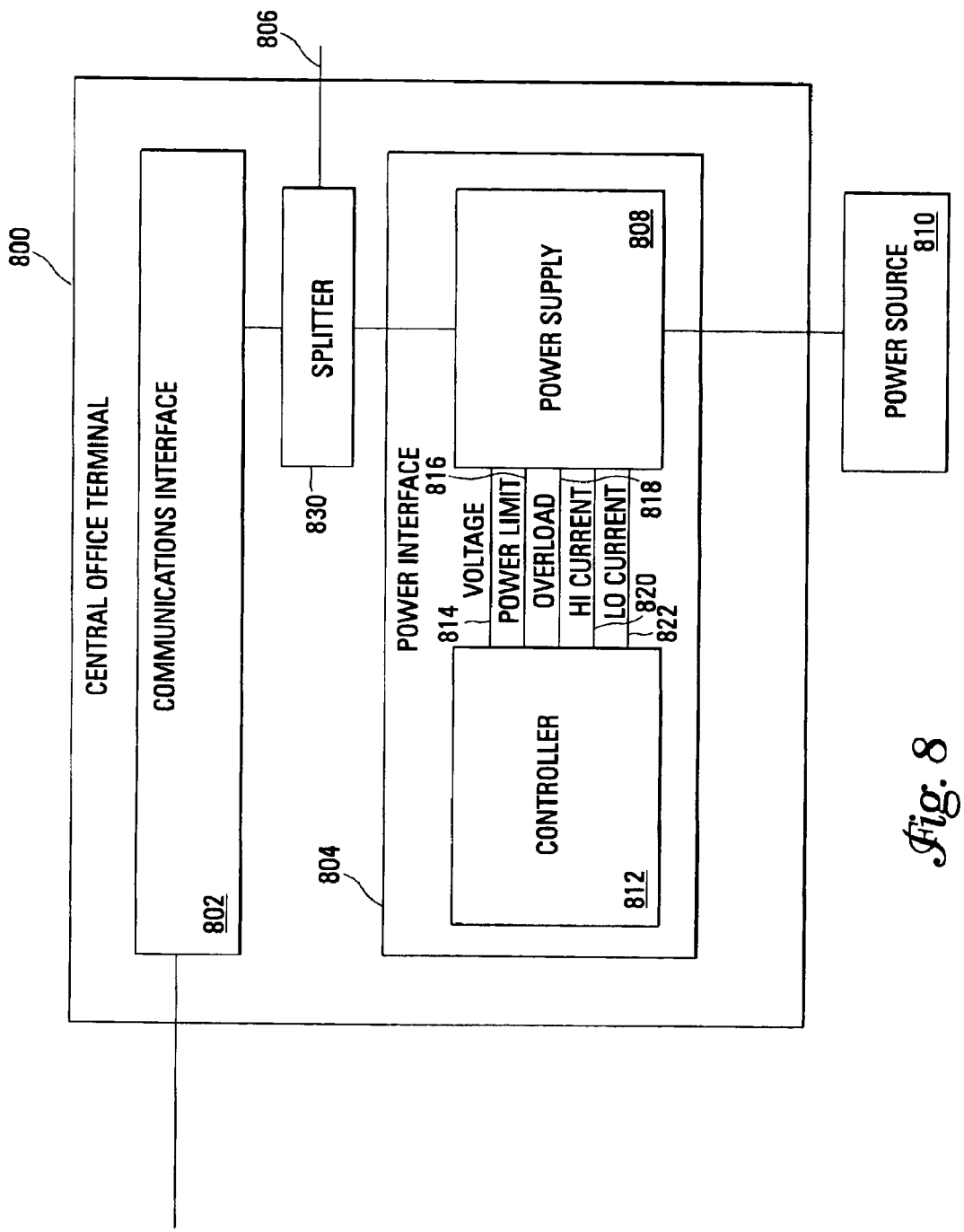
FIG. 8 is a block diagram of one embodiment of a central office according to the teachings of the present invention.

FIG. 8 is a block diagram of one embodiment of a central office terminal 800. Embodiments of central office terminal 800 are suitable for providing power to one or more remote terminals (or other network elements) over one or more twisted-pair telephone lines (or other communication medium). The embodiment of a central office terminal 800 shown in FIG. 8 includes communication interface 802 and a power interface 804. The communication interface 802 includes appropriate components for providing the various telecommunications service provided by the central office terminal 800. For example, in the embodiment shown in FIG. 6, the communications interface 802 couples the central office terminal 800 to at least one upstream G.SHDSL communication link and to at least one downstream G.SHDSL communication link (via a splitter 830 described below). The downstream G.SHDSL communication links is provided over at least one twisted-pair telephone line 806. The twisted-pair telephone line 806 is coupled, in one embodiment to one or more remote terminals (not shown in FIG. 8) that are powered by the central office terminal 800.

The power interface 804 includes a power supply 808 that is coupled to a power source 810. In general, the power supply 808 receives power from the power source 810 and conditions and supplies power on the twisted-pair telephone lines 806 in order to power a remote terminal coupled to the twisted-pair telephone line 806. In one such embodiment, the power supply 808 is implemented as a fly-back power supply. The central office terminal 800 includes a splitter 830 that combines an output communication signal from the communications interface 802 and an output power signal from the power interface 804 and applies the combined output signal to the twisted-pair telephone line 806. The splitter 830 also receives an input signal from the twisted-pair telephone line 806 and splits off that portion of the received input signal used for providing the downstream communication link and provides it to the communications interface 802 for appropriate processing. One embodiment of a splitter 830 is described in a co-pending application entitled "SPLITTER", The power interface 804 also includes a controller 812 that controls the operation of the power supply 808. In one such embodiment, controller 812 is implemented in hardware (for example, using analog and/or digital circuits) and/or in software (for example, by programming a programmable processor with appropriate instructions to carry out the various control functions described here). In other embodiments, the controller 812 is implemented in other ways. Although the controller 812 is shown as being a part of the power interface 804 in FIG. 8, in other embodiments the controller 812 is a part of a general controller or control circuitry for the central office terminal 800. In other embodiments, the functions performed by the controller 812 are incorporated directly into control circuitry of the power supply 808.

In the embodiment shown in FIG. 8, a voltage signal 814 is provided between the controller 812 and the power supply 808. The voltage signal 814 is used by the controller 812 to set a nominal voltage at which the power supply 808 is to supply power on the twisted-pair telephone line 806 in order to power a remote terminal coupled to the twisted-pair telephone line 806. A power limit signal 816 is provided between the controller 812 and the power supply 808. The power limit signal 816 is used by the controller 812 to set a power limit for the power supply 808. The power limit is a maximum power the power supply 808 is to provide on the twisted-pair telephone line 806.

An overload signal 818 is provided by the power supply 808 to the controller 812. The overload signal 818 is used by the power supply 808 to inform the controller 812 that the power supply 808 is currently supplying power with an output voltage that is below the nominal voltage specified on the voltage signal 814. This is referred to here as an "overload condition" or that the power supply 808 is "out of regulation." For example, when a remote terminal coupled to the twisted-pair telephone line 806 draws an amount of current that causes the amount of power supplied by the power supply 808 to exceed the power limit specified by the power limit signal 816, the power supply 808 drops the output voltage so that the total power supplied by the power supply 808 does not exceed the power limit. When an overload condition exists, the power supply 808 indicates that such an overload condition exists on the overload signal 818.

In the embodiment shown in FIG. 8, various current measurement signals are supplied by the power supply 808 to the controller 812. For example, a low current signal 822 is supplied by the power supply 808 to the controller 812 to indicate that the current currently supplied by the power supply 808 is below some relatively low threshold current value. A high current signal 820 is supplied by the power supply 808 to controller 812 to indicate that the current currently supplied by the power supply 808 is above some relatively high current value. In other embodiments, the amount of current currently supplied by the power supply 808 is measured and provided to the controller 812.

A number of embodiments of the invention defined by the following claims have been described. Nevertheless, it will be understood that various modifications to the described embodiments may be made without departing from the scope of the claimed invention. Accordingly, other embodiments are within the scope of the following claims.

What is claimed is:

1. A method of monitoring input voltage for a line-powered network element, the method comprising:
   receiving an input voltage for the line-powered network element;
   applying the input voltage across a primary winding of a flyback power converter during an on-time of a primary switch;
   transferring the input voltage from the primary winding to a secondary winding of the flyback power converter during an off-time of the primary switch;
   sensing the voltage of the secondary winding during the on-time of the primary switch; and
   drawing minimal current from the flyback power converter.

2. The method of claim 1, further comprising:
   producing an output voltage from the sensed voltage of the secondary winding; and
   determining when the input voltage is insufficient.

3. The method of claim 2, wherein the output voltage is proportional to the input voltage.

4. The method of claim 2, wherein the alarm signal indicates that the input voltage has fallen below a desired voltage.

5. The method of claim 2, wherein determining when the input voltage is insufficient comprises:
   comparing the output voltage to a reference voltage; and
   when the output voltage differs from the reference voltage by a defined criterion, producing an alarm signal.

6. A method of monitoring an input voltage of a line powered sink network element, the method comprising:
   receiving the input voltage;
   reflecting the input voltage on a secondary of a power supply;
   sensing the reflected voltage on the secondary while drawing minimal current form the power supply;

producing an output voltage that is proportional to the input voltage using the reflected voltage;

determining if the input voltage is close to a critical point;

producing an alarm signal when the input voltage is close to a critical point.

7. The method of claim 6, wherein determining if the input voltage is close to a critical point includes comparing the output voltage to a reference voltage.

8. The method of claim 7, wherein a critical point occurs when the output voltage falls below a defined amount.

9. The method of claim 6, wherein the power supply is a flyback power converter.

10. A system employing a voltage sensing circuit, the system comprising:

a line powered network element having a voltage input, including:

a power converter adapted to receive an input voltage; and a monitoring circuit coupled to the power converter, wherein the monitoring circuit selectively senses a voltage of a secondary winding of the power converter and provides an alarm signal when the input voltage falls below a reference voltage;

wherein the monitoring circuit is adapted to draw minimal current from the power converter.

11. The system of claim 10, wherein the power converter comprises a flyback power converter.

12. The system of claim 10, wherein the monitoring circuit includes a diode coupled to a secondary side of the power converter in an arrangement to conduct when a primary switch of the power converter is on.

13. The system of claim 12, wherein the monitoring circuit further includes an output filter coupled to the diode.

14. The system of claim 13, wherein the output filter comprises a resistance-capacitance circuit.

15. The system of claim 10, wherein the monitoring circuit includes a comparator circuit that determines when the input voltage falls below a reference voltage.

16. The system of claim 10, wherein the monitoring circuit provides an output voltage proportional to the input voltage.

17. An apparatus, comprising:

a flyback power converter;

a monitoring circuit coupled to a secondary side of the flyback power converter;

wherein the monitoring circuit selectively senses an input voltage to the flyback power converter from a reflected voltage of the input voltage, compares the input voltage to a reference voltage and provides an indication when the input voltage differs from the reference voltage by a defined amount; and wherein the monitoring circuit is adapted to draw minimal current from the flyback power converter.

18. The apparatus of claim 17, wherein the monitoring circuit includes a diode coupled to the secondary side of the flyback power converter in an arrangement to conduct when a primary switch is of the flyback power converter is on.

19. The apparatus of claim 18, wherein the monitoring circuit further includes an output filter coupled to the diode.

20. The apparatus of claim 19, wherein the output filter comprises a resistance-capacitance filter.

21. The apparatus of claim 17, wherein the monitoring circuit includes a comparator to compare the input voltage to the reference voltage.

22. A network element, comprising:

a power supply; and a monitoring circuit coupled to the power supply, including:

a voltage sensing circuit coupled to a secondary side of the power converter;

wherein the voltage sensing circuit monitors a reflected voltage of an input voltage to the power supply, compares the reflected voltage to a reference voltage and provides an indication when the reflected voltage differs from the reference voltage by a defined amount;

wherein the voltage sensing circuit monitors the input voltage without drawing current from the power converter.

* * * * *